(12) United States Patent
Terada et al.

(10) Patent No.: US 11,486,767 B2
(45) Date of Patent: Nov. 1, 2022

(54) SEMICONDUCTOR STORAGE DEVICE, METHOD OF CONTROLLING SEMICONDUCTOR STORAGE DEVICE, AND MEMORY SYSTEM

(71) Applicant: KIOXIA CORPORATION, Tokyo (JP)

(72) Inventors: Keisuke Terada, Kamakura Kanagawa (JP); Eietsu Takahashi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/189,140

(22) Filed: Mar. 1, 2021

(65) Prior Publication Data
US 2022/0065702 A1 Mar. 3, 2022

(30) Foreign Application Priority Data
Aug. 26, 2020 (JP) .............................. JP2020-142881

(51) Int. Cl.
| G11C 11/34 | (2006.01) |
| G01K 1/022 | (2021.01) |
| G11C 16/34 | (2006.01) |
| G11C 16/26 | (2006.01) |
| G11C 16/16 | (2006.01) |

(52) U.S. Cl.
CPC ............. *G01K 1/022* (2013.01); *G11C 16/16* (2013.01); *G11C 16/26* (2013.01); *G11C 16/3445* (2013.01); *G11C 16/3459* (2013.01)

(58) Field of Classification Search
CPC ........ G01K 1/022; G11C 16/16; G11C 16/26; G11C 16/3445; G11C 16/3459
USPC .......................................................... 365/212
See application file for complete search history.

(56) References Cited

U.S. PATENT DOCUMENTS

| 2015/0149816 A1 | 5/2015 | Antonakopoulos et al. |
| 2018/0261290 A1 | 9/2018 | Uehara et al. |
| 2018/0293029 A1* | 10/2018 | Achtenberg ........... G11C 16/26 |
| 2019/0228826 A1 | 7/2019 | Yamamoto et al. |

FOREIGN PATENT DOCUMENTS

| JP | 2008-097758 A | 4/2008 |
| TW | 201933368 A | 8/2019 |

* cited by examiner

*Primary Examiner* — Huan Hoang
(74) *Attorney, Agent, or Firm* — Kim & Stewart LLP

(57) ABSTRACT

A semiconductor storage device includes a memory cell and a control circuit configured to, upon receipt of a command, acquire a first temperature measured by a temperature sensor, and perform an operation corresponding to the command using a parameter corrected based on temperature. When the first temperature is within a predetermined range with respect to a second temperature measured before the command is received, the parameter is corrected using the second temperature. When the first temperature is outside the predetermined range, the parameter is corrected using the first temperature.

20 Claims, 4 Drawing Sheets

SEMICONDUCTOR STORAGE DEVICE, METHOD OF CONTROLLING SEMICONDUCTOR STORAGE DEVICE, AND MEMORY SYSTEM

CROSS-REFERENCE TO RELATED APPLICATION

This application is based upon and claims the benefit of priority from Japanese Patent Application No. 2020-142881, filed Aug. 26, 2020, the entire contents of which are incorporated herein by reference.

FIELD

Embodiments described herein relate generally to a semiconductor storage device, a method of controlling a semiconductor storage device, and a memory system.

BACKGROUND

In a semiconductor storage device, setting parameters for a data reading operation or the like may be adjusted according to the temperature of the semiconductor storage device. Therefore, the temperature of the semiconductor storage device itself may be measured by a temperature sensor. In such a semiconductor storage device, the values of the required setting parameters can be corrected based on the temperature measured by the temperature sensor. However, when device operations are being constantly performed according to various received commands, if a setting parameter is corrected due to a fluctuation in the measured temperature, the output result from a commanded device operation may be different even if though the same operation was just recently performed. For example, when operations corresponding to read commands are performed continuously, back-to-back or the like, the read data that is output in respond to a read command may be changed due to a fluctuation of the measured temperature.

DETAILED DESCRIPTION

Embodiments provide a semiconductor storage device for which output results are not changed due to temperature fluctuations when operations corresponding to a command are continuously performed.

In general, according to one embodiment, a semiconductor storage device includes a memory cell and a control circuit configured to, upon receipt of a command, acquire a first temperature measured by a temperature sensor, and perform an operation corresponding to the command using a parameter corrected based on temperature. When the first temperature is within a predetermined range with respect to a second temperature measured before the command is received, the parameter is corrected using the second temperature. When the first temperature is outside the predetermined range, the parameter is corrected using the first temperature.

Hereinafter, embodiments will be described with reference to the drawings. In the present specification and the drawings, elements identical to those described in a prior drawing are denoted by the reference symbols, and additional explanations thereof may be omitted as appropriate.

First Embodiment

Figure 1:
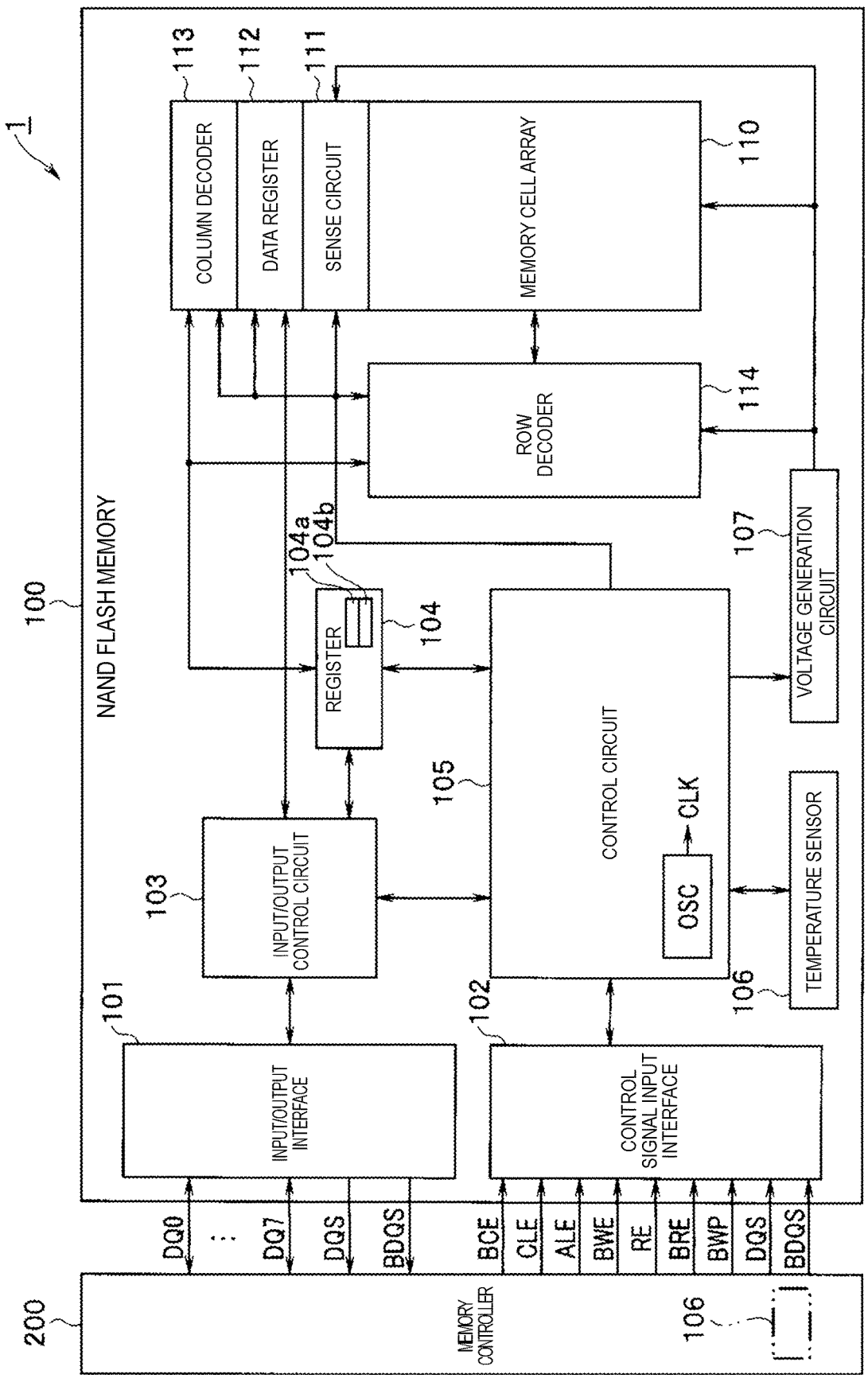
FIG. 1 is a block diagram showing a memory system including a semiconductor storage device according to a first embodiment.

FIG. 1 is a block diagram showing a memory system 1 including a semiconductor storage device according to a first embodiment. The memory system 1 includes a NAND flash memory 100 as an example of the semiconductor storage device and a memory controller 200. The NAND flash memory 100 (hereinafter, also referred to as memory 100) and the memory controller 200 may make up one semiconductor device, for example, a memory card such as an SD card and a solid-state drive (SSD) and the like. The memory system 1 may further include a host device.

The memory controller 200 outputs, to the memory 100, a command and the like required for the operation of the memory 100. The memory controller 200 reads data from the memory 100 by outputting the command to the memory 100, and writes or erases the data to and from the memory 100.

The memory controller 200 and the memory 100 are connected via an input/output interface 101 and a control signal input interface 102.

The input/output interface 101 generates data strobe signals DQS and BDQS (i.e., a complementary signal of DQS) according to signals supplied from an input/output control circuit 103. The input/output interface 101 outputs the data strobe signals DQS and BDQS when outputting the data from data input/output lines DQ0 to DQ7. Then, the memory controller 200 receives the data from the data input/output lines DQ0 to DQ7 in accordance with a timing of the data strobe signals DQS and BDQS. Further, the input/output interface 101 includes, for example, a command input terminal, an address input terminal, and the like.

The control signal input interface 102 receives, from the memory controller 200, a chip enable signal BCE, a command latch enable signal CLE, an address latch enable signal ALE, a write enable signal BWE, read enable signals RE and BRE (i.e., a complementary signal of RE), a write protect signal BWP, and DQS and BDQS.

The chip enable signal BCE is used as a selection signal of the memory 100. The command latch enable signal CLE is a signal used when fetching an operation command into a register 104. The address latch enable signal ALE is a signal used when fetching address information or input data into the register 104. The write enable signal BWE is a signal for fetching commands, addresses, and data on the input/output interface 101 into the memory 100. The read enable signals RE and BRE are signals used when the data is output from the input/output interface 101 in serial. The write protect signal BWP is used to protect data from unexpected erasure or write when the input signal is uncertain, such as when power of the memory 100 is turned on or when the power is cut off.

Although not shown in FIG. 1, the NAND flash memory 100 also includes an R/B (ready/busy) terminal showing an internal operation state of the NAND flash memory 100, a Vcc/Vss/Vccq/Vssq terminal for power supply, and the like.

The input/output control circuit 103 outputs data read from a memory cell array 110 to the memory controller 200 via the input/output interface 101. The input/output control circuit 103 receives various commands, addresses, and write data for writing, reading, erasing, status reading, and the like via the input/output interface 101.

The control circuit 105 supplies a control signal that is input via the control signal input interface 102 to the input/output control circuit 103. The control circuit 105 controls a temperature sensor 106, a voltage generation circuit 107, a sense circuit 111, a data register 112, a column decoder 113, a row decoder 114, and the register 104.

The control circuit 105 operates according to the control signal and the command that is input via the register 104. The control circuit 105 controls the voltage generation circuit 107 to apply a desired voltage to the memory cell array 110, the sense circuit 111, and the row decoder 114 when performing program, verify, read, and erase operations.

The control circuit 105 has an oscillator OSC and generates a clock signal CLK (hereinafter simply referred to as "clock") to operate the memory cell array 110. The oscillator OSC starts up, for example, when the chip enable signal BCE is received from the memory controller 200 via the control signal input interface 102, and starts to generate the clock. Based on the clock from the oscillator OSC, the voltage generation circuit 107 applies a voltage to the memory cell array 110 to perform the program, verify, read, erase operations, and the like. That is, the oscillator OSC does not generate the clock in the standby or ready state until the chip enable signal BCE is received from the memory controller 200 (or the memory 100 is selected by the memory controller 200). On the other hand, the oscillator OSC starts to generate the clock when the memory 100 is selected by the memory controller 200 and enters a start-up or busy state.

In FIG. 1, the input/output control circuit 103 and the control circuit 105 are illustrated as independent circuits. However, the input/output control circuit 103 and the control circuit 105 may be integrated into a single circuit.

The register 104 stores the command that is input from the input/output control circuit 103 and is output to the control circuit 105. The register 104 latches the address supplied from, for example, the memory controller 200. Then, the register 104 converts the latched address into an internal physical address (i.e., column and row addresses). Then, the column address is read by the column decoder 113 and the row address is read by the row decoder 114.

The register 104 stores various internal states of the memory 100. The register 104 includes a ready/busy register that stores data indicating whether the memory 100 is in a ready/busy state, and a write status register that stores data indicating a pass/fail status of the write. Further, temperature data is also stored in the register 104.

The temperature sensor 106 is provided on a semiconductor chip on which the memory 100 and the control circuit 105 are mounted, and measures a temperature of the memory 100. The temperature sensor 106 measures the temperature of the memory 100 in response to an instruction from the control circuit 105, and generates a temperature code indicating the temperature of the memory 100. The temperature sensor 106 outputs the generated temperature code to the control circuit 105. The temperature code is indicated by a plurality of bit data. The control circuit 105 acquires the temperature code from the temperature sensor 106, and stores temperature data corresponding to the temperature code in the register 104.

The register 104 stores data of two latest temperatures. The register 104 includes a register 104a for storing the temperature data corresponding to the latest temperature code and a register 104b for storing the temperature corresponding to the temperature code obtained prior to the latest temperature code. That is, the register 104 stores data of two temperatures which is a temperature corresponding to the latest temperature code obtained in response to the instruction from the control circuit 105, and a temperature corresponding to a temperature code obtained prior to the latest temperature code.

The temperature sensor 106 is provided in the memory 100 here, but may be provided in the memory controller 200 as indicated by an alternate long and short dash line.

Further, the control circuit 105 supplies, to the voltage generation circuit 107, a voltage generation signal TOUT based on the temperature code. The voltage generation circuit 107 generates various voltages based on the voltage generation signal TOUT. The voltage generation circuit 107 generates various voltages used when erasing the data, writing the data (that is, programming the data), and reading the data.

The memory cell array 110 includes a plurality of bit lines BL, a plurality of word line WL, and a source line SL. The memory cell array 110 includes a plurality of blocks BLK in which a plurality of electrically rewritable memory cell transistors (also simply referred to as memory cells) MC are arranged in a matrix configuration. The data is erased in units of the block BLK.

The memory cell MC has, for example, a stack gate including a control gate electrode and a charge storage layer (for example, a floating gate electrode), and stores binary or multi-valued data depending on a change in threshold voltage of a transistor determined by an amount of charge injected into the floating gate electrode. That is, the memory cell MC may be a single-level cell (SLC), a multi-level cell (MLC), or a triple level cell (TLC). Further, the memory cell MC may have a metal-oxide-nitride-oxide-silicon (MONOS) structure that traps electrons in a nitride film.

The data is read and written in units of a page of a particular number of memory cells. The page is a set of bits stored in a plurality of memory cells MC connected to the same word line WL.

Other configurations may be used for the memory cell array 110. That is, the configuration of the memory cell array 110 is disclosed in, for example, U.S. patent application Ser. No. 12/407,403 filed on Mar. 19, 2009, entitled "THREE DIMENSIONAL STACKED NONVOLATILE SEMICONDUCTOR MEMORY". In addition, the configurations of the memory cell array 110 are disclosed in U.S. patent application Ser. No. 12/406,524, entitled "THREE DIMENSIONAL STACKED NONVOLATILE SEMICONDUCTOR MEMORY", filed on Mar. 18, 2009; U.S. patent application Ser. No. 12/679,991, entitled "NONVOLATILE SEMICONDUCTOR MEMORY DEVICE AND METHOD OF MANUFACTURING THE SAME, filed on Mar. 25, 2010; U.S. patent application Ser. No. 13/816,799, entitled "NONVOLATILE SEMICONDUCTOR MEMORY DEVICE", filed on Sep. 22, 2011; and U.S. patent application Ser. No. 12/532,030, entitled "SEMICONDUCTOR MEMORY AND METHOD FOR MANUFACTURING THE SAME", filed on Mar. 23, 2009. The entire contents of these patent applications are incorporated in the present specification by reference.

Further, the configuration of the memory cell array 110 is disclosed in, for example, U.S. patent application Ser. No. 12/397,711, entitled "SEMICONDUCTOR MEMORY DEVICE HAVING PLURALITY OF TYPES OF MEMORIES INTEGRATED ON ONE CHIP", filed on Mar. 3, 2009. In addition, the configurations of the memory cell array 110 are disclosed in U.S. patent application Ser. No. 13/451,185, entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE", filed on Apr. 19, 2012; U.S. patent application Ser. No. 12/405,626, entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", filed on Mar. 17, 2009; and U.S. patent application Ser. No. 09/956,986, entitled "NONVOLATILE SEMICONDUCTOR MEMORY DEVICE HAVING ELEMENT ISOLATING REGION OF TRENCH TYPE AND METHOD OF MANUFACTURING THE SAME", filed on Sep. 21, 2001. The entire contents of these patent applications are incorporated in the present specification by reference.

The sense circuit 111 senses the data read into the bit line from each memory cell MC during the data read operation. The data is read in page units.

The data register 112 is an SRAM or the like. The data register 112 stores the data supplied from the memory controller 200, a verification result detected by the sense circuit 111, and the like.

The column decoder 113 decodes a column address signal and outputs a selection signal for selecting one of the bit lines BL to the sense circuit 111.

The row decoder 114 decodes a row address signal. Then, the row decoder 114 selects and drives the word line WL of the memory cell array 110 and select gate lines SGD and SGS.

When a write request is received from a host, the memory controller 200 outputs various signals to the control signal input interface 102, and outputs a write command and user data received from the host to the input/output interface 101. According to the write command, the control circuit 105 controls each circuit in the NAND flash memory 100 to write the user data to the memory cell array 110.

When a read request is received from the host, the memory controller 200 outputs various signals to the control signal input interface 102, and outputs the read command and an address via the input/output interface 101.

According to the read command, the control circuit 105 controls each circuit in the NAND flash memory 100 to read the user data from the memory cell array 110, and outputs the read user data to the memory controller 200 via the input/output interface 101.

When various commands are received from the memory controller 200, the control circuit 105 controls the temperature sensor 106 to measure a temperature, and performs temperature correction that corrects a read voltage or the like based on the measured temperature.

When the read command is received, the control circuit 105 controls the temperature sensor 106 to measure a temperature, and performs the temperature correction process for correcting a read voltage (that is, read level) or the like based on the measured temperature. The read voltage is a so-called valley position voltage for reading the data correctly based on threshold voltage distribution of the memory cell MC. When the memory cell MC can take eight states according to the threshold voltage, seven read voltages corresponds to the eight states.

When the read command is received, in the temperature correction process, the read voltage is adjusted so as to be shifted from a predetermined read level by a predetermined shift amount. When the write command is received, a verify voltage can be adjusted according to the measure temperature in the temperature correction process. When the erase command is received, a voltage (the erase voltage) applied at the time of erasing, a verification voltage applied after the erase voltage, and the like can be adjusted according to the measured temperature in the temperature correction process.

In an embodiment, when the read command is received, the temperature correction process is performed based on (i) a currently measured temperature $T_n$ if the temperature $T_n$ is not within a predetermined range TH with respect to a previously measured temperature $T_{(n-1)}$, or (ii) the previously measured temperature $T_{(n-1)}$ if the currently measured temperature $T_n$ is within the predetermined range TH with respect to the previously measured temperature $T_{(n-1)}$. The predetermined range TH is a temperature range of ±k with respect to the previously measured temperature $T_{(n-1)}$.

For example, if k is 5 degrees, the control circuit 105 performs the temperature correction process based on the previously measured temperature $T_{(n-1)}$ when the currently measured temperature $T_n$ is inside the range TH of ±5 degrees from the previously measured temperature $T_{(n-1)}$.

Further, when the write command or the erasure command is received, the control circuit 105 measures the temperature by the temperature sensor 106, and performs the temperature correction process for correcting a voltage applied to the word line WL, a verification voltage, or the like, according to the measured temperature.

The control circuit 150 performs an operation according to the command using a value of a setting parameter adjusted by the temperature correction process. That is, the control circuit 150 performs an operation for the memory 100 in response to the received command using the value adjusted based on the temperature measured by the temperature sensor 106.

Figure 2:
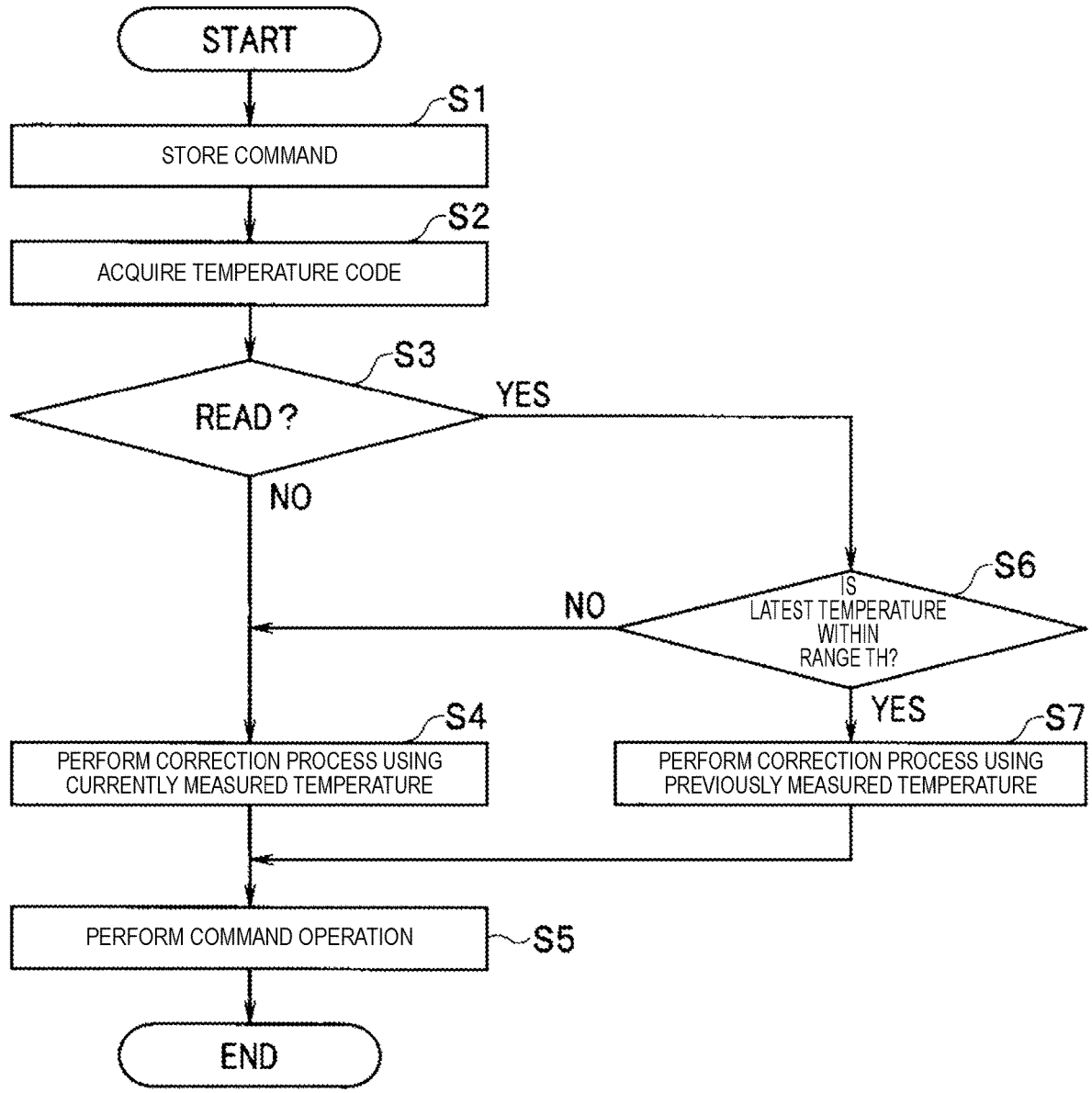
FIG. 2 is a flowchart of a process executed when a command is received from a memory controller according to a first embodiment.

FIG. 2 is a flowchart of a process executed by the control circuit 105 when a command is received from the memory controller 200.

The control circuit 105 stores the received command in the register 104 (S1).

After performing S1, the control circuit 105 instructs the temperature sensor 106 to measure a temperature and acquires the temperature code as a measurement result (S2). The temperature code acquired in S2 is stored in the register 104, and the temperature data corresponding to the temperature code is stored in the register 104a as the latest temperature $T_n$.

The control circuit 105 reads the command stored in the register 104, and determines whether the command received in S1 is a read command (S3).

When the command received in S1 is not a read command (S3: NO), the control circuit 105 performs the temperature correction process using the currently measured temperature (S4). That is, the control circuit 105 performs the temperature correction process for changing the voltage applied to the word line WL, the verification voltage, and the like, based on the latest temperature $T_n$ according to the temperature code acquired in S2 (S4).

After performing S4, the control circuit 105 performs an operation according to the received command such as a write command using the value corrected by the temperature correction process (S5). For example, when the command received in S1 is a write command or an erasure command, the data is written or erased using the corrected value based on the latest temperature $T_n$.

When the command received in S1 is a read command (S3: YES), the control circuit 105 determines whether the latest temperature $T_n$ acquired in S2 according to the temperature code is within the predetermined range TH with respect to the previously measured temperature $T_{(n-1)}$ (S6).

When the latest temperature $T_n$ is not within the predetermined range TH with respect to the previously measured temperature $T_{(n-1)}$ (S6: NO), the process proceeds to S4.

That is, since the temperature has changed by more than the predetermined range TH, the temperature correction process is performed at the latest temperature $T_n$ corresponding to the temperature code acquired in S2 (S4), and a read operation is performed using an adjusted value of the read voltage set based on the latest temperature $T_n$ (S5).

When the latest temperature $T_n$ is within the predetermined range TH from the previously measured temperature $T_{(n-1)}$ (S6: YES), the control circuit 105 performs the temperature correction process using the previously measured temperature $T_{(n-1)}$ (S7). After performing S7, the control circuit 105 performs an operation corresponding to the read command using the value of the read voltage set based on the previously measured temperature $T_{(n-1)}$ (S5).

Thus, even if the latest temperature $T_n$ is different from the previously measured temperature $T_{(n-1)}$ by some amount, there will be no difference in the reading result because the same setting parameter as was used in the previous reading will be selected in the temperature correction process so long as the latest temperature $T_n$ is still within the predetermined range TH from the measured temperature $T_{(n-1)}$ (S6: YES).

When the temperature is measured by the temperature sensor 106 for the first time, a previously measured temperature $T_{(n-1)}$ does not exist, and therefore, it is determined that the latest temperature $T_n$ is not within the predetermined range TH (S6: NO), and the process of S4 is performed. That is, the temperature correction process is performed using the latest temperature $T_n$ for the first time (S4), and the read operation is performed if the command is a read command (S5).

As described above, the control circuit 105 performs the operation corresponding to the received command using the corrected value set based on the latest temperature $T_n$ when the latest temperature $T_n$ is not within the predetermined range TH from the temperature $T_{(n-1)}$. The latest temperature $T_n$ is measured by the temperature sensor 106 when the command is received. Further, the control circuit 105 performs the operation corresponding to the received command using the corrected value set based on the previously measured temperature $T_{(n-1)}$ when the latest temperature $T_n$ is within the predetermined range TH with respect to the temperature $T_{(n-1)}$.

Therefore, according to the above-described embodiments, when a read command is performed, the corrected value set by the temperature correction process will be based on the same shift amount as in a previous reading unless the measured latest temperature $T_n$ is outside the predetermined range TH with respect to the previously measured temperature $T_{(n-1)}$, and therefore, the read data will not be affected by a relatively small change in temperature. That is, the read voltage will be adjusted/corrected by using the same shift amount as a previous reading even though the temperature has fluctuated after the previous reading.

The read command may perform a retry read. The retry read is a reading method in which when the data read in response to a read command fails to be correctable by an error correction process, so another reading of the data is performed after changing the read voltage.

Since the shift amount of the read voltage at the time of a retry read also differs depending on the temperature, the read data may change if a setting parameter such as the shift amount is switched due to a temperature fluctuation when the retry read is performed.

Figure 3:
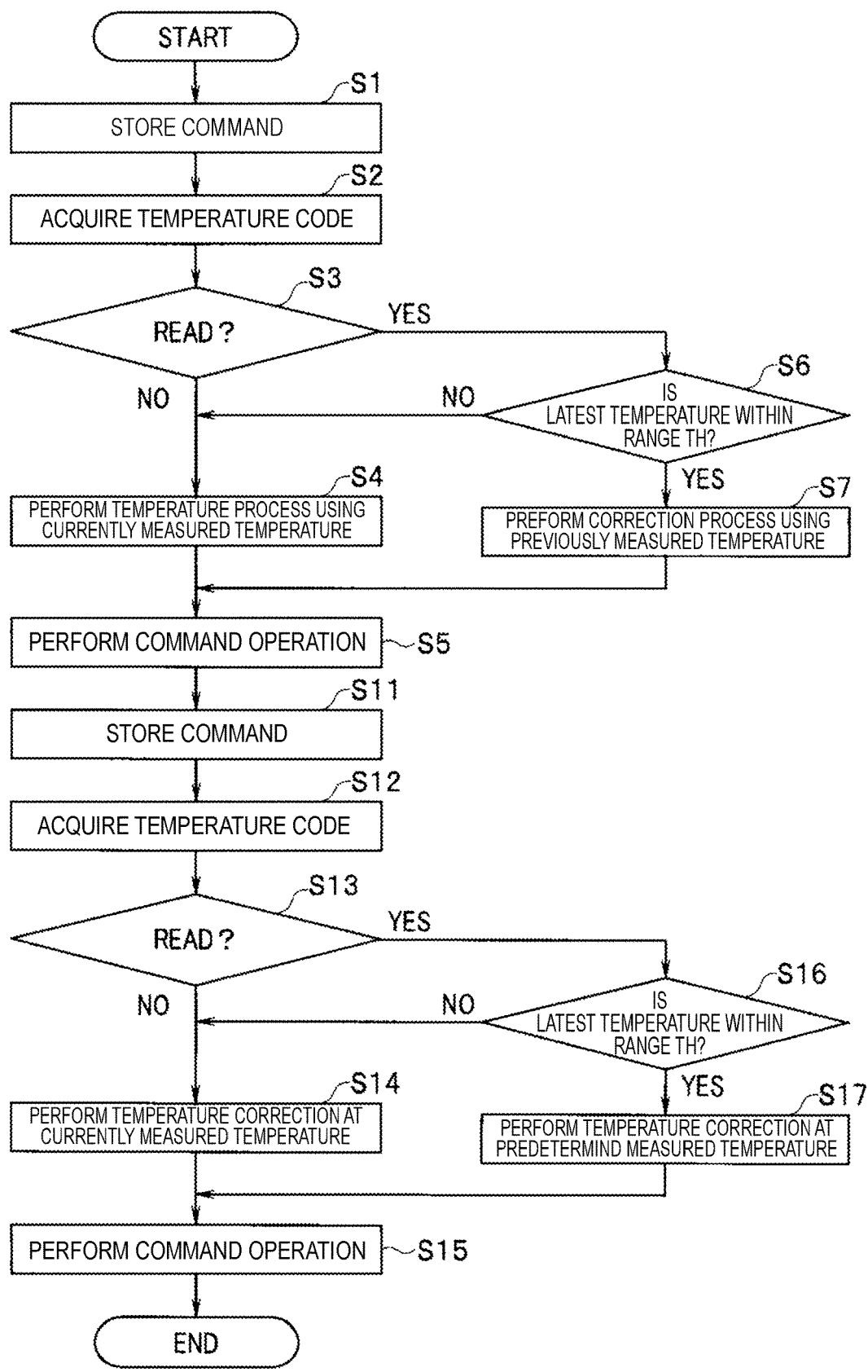
FIG. 3 is a flowchart of a process executed when retry read is performed according to a first embodiment.

FIG. 3 is a flowchart of a process executed by the control circuit 105 when the retry read is performed. S1 to S7 in FIG. 3 are the same processes as in FIG. 2.

After performing the process of S7, if an error check and correct (ECC) circuit fails to correct the error in the memory controller 200, the memory controller 200 outputs another read command with a changed read voltage (this may be referred to as a read command for a retry read or more simply a retry read command) to the memory 100.

In such a case, the control circuit 105 stores the received command to the register 104 (S11). In a case of retry read, the control circuit 105 receives the read command.

After performing S11, the control circuit 105 instructs the temperature sensor 106 to measure the temperature and acquires the temperature code which is a measurement result (S12). The temperature code acquired in S12 is stored in the register 104, and the temperature data corresponding to the temperature code is stored in the register 104a as the latest temperature $T_n$. The temperature data corresponding to the temperature code acquired in S2 is stored in the register 104b as the previously measured temperature $T_{(n-1)}$.

The control circuit 105 reads the command stored in the register 104, and determines whether the command received in S11 is a read command (S13).

When the command received in S11 is a read command (S13: YES), the control circuit 105 determines whether the latest temperature $T_n$ acquired in S12 according to the temperature code is within the predetermined range TH with respect to the previously measured temperature $T_{(n-1)}$ (S16).

When the latest temperature $T_n$ acquired in S12 is not within the predetermined range TH with respect to the previously measured temperature $T_{(n-1)}$ (S16: NO), the process proceeds to S14.

That is, since the latest temperature $T_n$ has changed by exceeding the predetermined range TH with respect to the previously measured temperature $T_{(n-1)}$, the temperature correction process is performed based on the latest temperature acquired in S12 (S14), and the read operation is performed using the corrected read voltage set based on the latest temperature $T_n$ (S15).

When the latest temperature $T_n$ acquired in S12 is within the predetermined range TH with respect to the previously measured temperature $T_{(n-1)}$ (S16: YES), the control circuit 105 performs the temperature correction process using the previously measured temperature $T_{(n-1)}$ (S17). After performing S17, the control circuit 105 performs an operation (a retry read) corresponding to the read command using the corrected value of the read voltage set based on the previously measured temperature $T_{(n-1)}$ (S15).

When the command received in S11 is not the read command (S13: NO), the control circuit 105 performs the temperature correction process for correcting the voltage applied to the word line WL, the verification voltage, and the like, based on the latest temperature $T_n$ according to the temperature code acquired in S12 (S14).

After performing S14, the control circuit 105 performs an operation according to the received command such as a write command using the corrected value set based on the latest temperature $T_n$ (S15).

For example, when the command received in S11 is a write command or an erasure command, the data is written or erased using the corrected value set based on the latest temperature $T_n$ stored in the register 104a.

As described above, when the received command is a read command of the data from the memory 100, the control circuit 105 performs a data read operation using the corrected value set based on the latest temperature $T_n$ when the latest temperature $T_n$ is not within the predetermined range from the previously measured temperature $T_{(n-1)}$, and performs the data read operation using the corrected value set based on the temperature $T_{(n-1)}$ when the latest temperature $T_n$ is within the predetermined range from the previously measured temperature $T_{(n-1)}$.

Therefore, the above-described embodiments can provide semiconductor storage devices in which output results are consistent regardless of certain temperature fluctuations when the operations corresponding to a plurality of commands are continuously performed.

Second Embodiment

In a first embodiment, it was determined whether the latest temperature is within the predetermined range with respect to the previous temperature only for a read command. However, in a second embodiment, it is determined whether the latest temperature is within a predetermined range with respect to the previous temperature for other commands besides a read command.

Since the configuration of the memory system 1 of the second embodiment is the same as that of the memory system of the first embodiment, the same components will be represented by the same reference symbols and additional description thereof will be omitted, and differences will be described.

Figure 4:
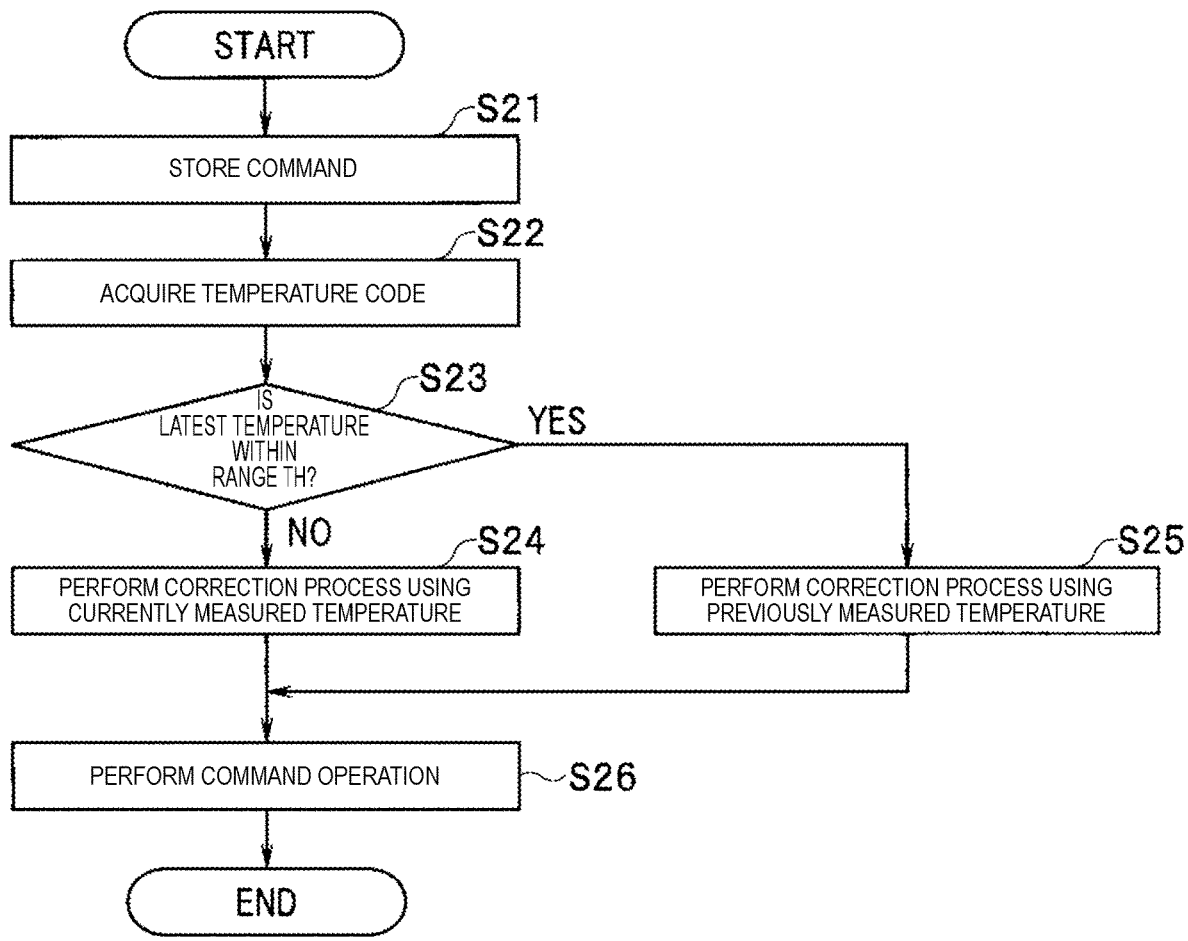
FIG. 4 is a flowchart of a process executed when a data read command is received from a memory controller according to a second embodiment.

FIG. 4 is a flowchart of a process executed by the control circuit 105 when a command is received from the memory controller 200.

The control circuit 105 stores the received command in the register 104 (S21).

After performing S21, the control circuit 105 instructs the temperature sensor 106 to measure the temperature and acquires the temperature code which is a measurement result (S22). The temperature code acquired in S22 is stored in the register 104, and the temperature data corresponding to the temperature code is stored in a register 104a as the latest temperature $T_n$.

When the control circuit 105 determines whether the latest temperature $T_n$ corresponding to the temperature code acquired in S22 is within the predetermined range TH with respect to the previously measured temperature $T_{(n-1)}$ (S23).

When the latest temperature $T_n$ is not within the predetermined range TH with respect to the previously measured temperature $T_{(n-1)}$ (S23: NO), the process proceeds to S24.

That is, since the temperature change has changed by exceeded the predetermined range TH, the temperature correction process is performed based on the temperature corresponding to the temperature code acquired in S22 (S24), and an operation corresponding to the received command is performed using a corrected value set based on the latest temperature $T_n$ (S26).

When the latest temperature $T_n$ is still within the predetermined range TH from the previously measured temperature $T_{(n-1)}$ (S23: YES), the control circuit 105 performs the temperature correction process using the previously measured temperature $T_{(n-1)}$ (S25). After performing S25, the control circuit 105 performs an operation corresponding to the received command using the corrected value set based on the previously measured temperature $T_{(n-1)}$ (S26).

In a case of FIG. 4, when the last of the continuously received commands is received and the latest temperature $T_n$ is within the predetermined range TH (S23: YES), the temperature correction process is performed using the previously measured temperature $T_{(n-1)}$ (S25), and thus the last of the commands is performed using the corrected value set based on the previously measured temperature $T_{(n-1)}$ (S26).

When the last of the continuously received commands is received and the latest temperature $T_n$ is not within the predetermined range TH (S23: NO), the temperature correction process is performed using the latest temperature $T_n$ (S24), and the last of the commands is performed using the corrected value set based on the latest temperature $T_n$ (S26).

The process of FIG. 4 can be performed when a data write command is received, a data erasure command is received, or a data read command is received.

For example, when the received command is a read command for a retry read, if the latest temperature $T_n$ is within the predetermined range TH (S23: YES), since the same shift amount as in the previous reading is selected for the temperature correction process, the read data will not be affected by a change in temperature.

In the second embodiment, it is determined that the retry read-related command is not a read command. However, the retry read in the second embodiment is handled similar to the first embodiment, and thus an output result is the same as that in the first embodiment when the retry read is performed.

As described above, the control circuit 105 performs the operation corresponding to the command using the corrected value based on the latest temperature $T_n$ when the latest temperature $T_n$ is not within the predetermined range TH with respect to the temperature $T_{(n-1)}$. The latest temperature $T_n$ is measured by the temperature sensor 106 when the command is received. Further, the control circuit 105 performs the operation corresponding to the command using the corrected value based on the temperature $T_{(n-1)}$ when the latest temperature $T_n$ is within the predetermined range TH with respect to the temperature $T_{(n-1)}$.

Therefore, the above-described embodiments can provide semiconductor storage devices in which output results are consistent regardless of the temperature fluctuation when the operations corresponding to a plurality of commands are continuously performed.

In the related art, since the temperature code acquisition process is performed by the temperature sensor in response to each reception of a command, the temperature correction process is performed according to the acquired temperature each time a command is received. When the same command is received back-to-back, if the most recently acquired temperature is different from the previously acquired temperature, the setting parameter may be changed, by the temperature correction process, to a different value from the previous value used for the previous instance of the command, and thus the output result (for example, read data) may be different from the previous result.

To avoid such a problem, it might be considered to perform a sequence of commanded operations including two instances of the same command back-to-back or otherwise in quick succession so as to divide the commands in the sequence into two case types, one case where a temperature code is acquired another case where the temperature code is not acquired. However, such a solution would requires creation or rewriting of the operation sequence to assign the different case types to the repeated commands in the sequence, and a workload for handling the operation sequence is increased and, in general, the work is complicated.

However, according to the embodiments described above, it can be determined whether or not to use the previous setting value based simply on whether or not the temperature acquired at the start of performing a command is within a predetermined range TH from the previously acquired temperature of a prior-executed command. Therefore, a simple operation sequence can be utilized.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a memory cell; and
a control circuit configured to:
acquire a first temperature measured by a temperature sensor upon receipt of a command; and
perform an operation corresponding to the command using a parameter corrected based on a temperature measured by the temperature sensor, wherein
when the first temperature is within a predetermined range with respect to a second temperature measured before the command is received, the parameter is corrected using the second temperature, and
when the first temperature is outside the predetermined range, the parameter is corrected using the first temperature.

2. The semiconductor storage device according to claim 1, wherein the control circuit is further configured to:
determine whether the received command is a read command, and
upon determining that the received command is the read command, perform a read operation corresponding to the read command with a read voltage corrected using:
the second temperature when the first temperature is within the predetermined range and
the first temperature when the first temperature is outside the predetermined range.

3. The semiconductor storage device according to claim 2, wherein, if the received command is not the read command, the controller performs the operation corresponding to the received command with the parameter corrected using the first temperature even if the first temperature is within the predetermined range.

4. The semiconductor storage device according to claim 2, wherein
the read command is a read command for retry read, and
the parameter is a particular shift amount for a read voltage.

5. The semiconductor storage device according to claim 1, wherein
the command is a write command, and
the parameter is a verification voltage applied to the memory cell after data is written to the memory cell by a program operation.

6. The semiconductor storage device according to claim 1, wherein
the command is an erase command, and
the parameter is one of:
an erase voltage applied to the memory cell when data stored in the memory cell is erased, and
a verification voltage applied to the memory cell after the data is erased.

7. The semiconductor storage device according to claim 1, wherein the temperature sensor is on a semiconductor chip on which the memory cell and the control circuit are mounted.

8. The semiconductor storage device according to claim 1, further comprising:
a first register that stores the first temperature; and
a second register that stores the second temperature.

9. The semiconductor storage device according to claim 8, wherein the control circuit is further configured to store codes corresponding to the first and second temperatures in the first and second registers.

10. The semiconductor storage device according to claim 1, further comprising:
an interface circuit through which the command is received from a memory controller including the temperature sensor.

11. A method of controlling a semiconductor storage device, the method comprising:
acquiring a first temperature measured by a temperature sensor upon receipt of a command; and
performing an operation corresponding to the received command using a parameter corrected for temperature, wherein
when the first temperature is within a predetermined range with respect to a second temperature measured before the command is received, the parameter is corrected using the second temperature, and
when the first temperature is outside the predetermined range, the parameter is corrected using the first temperature.

12. The method according to claim 11, further comprising:
determining whether the received command is a read command, wherein
when the received command is the read command, performing a read operation corresponding to the read command with a read voltage corrected using:
the second temperature when the first temperature is within the predetermined range and
the first temperature when the first temperature is outside the predetermined range.

13. The method according to claim 12, wherein, if the received command is not the read command, the operation corresponding to the received command is performed with the parameter corrected using the first temperature even if the first temperature is within the predetermined range.

14. The method according to claim 12, wherein
the read command is a read command for retry read, and
the parameter is a particular shift amount for a read voltage.

15. The method according to claim 11, wherein
the command is a write command, and
the parameter is a verification voltage applied to a memory cell after data is written to the memory cell by a program operation.

16. The method according to claim 11, wherein
the command is an erase command, and
the parameter indicates is of:
an erase voltage applied to a memory cell when data stored in the memory cell is erased, and a verification voltage applied to the memory cell after the data is erased.

17. The method according to claim 11, wherein the temperature sensor is in the semiconductor storage device.

18. The method according to claim 11, further comprising:
   storing the first temperature in a first register; and
   storing the second temperature in a second register.

19. The method according to claim 18, wherein codes corresponding to the first and second temperatures are stored in the first and second registers.

20. A memory system, comprising:
   a controller configured to issue a command; and
   a semiconductor storage device including:
      a memory cell, and
      a control circuit configured to:
         acquire a first temperature measured by a temperature sensor upon receipt of the command from the controller; and
         perform an operation corresponding to the command using a parameter corrected based on a temperature, wherein
      when the first temperature is within a predetermined range with respect to a second temperature measured before the command is received, the parameter is corrected using the second temperature, and
      when the first temperature is outside the predetermined range, the parameter is corrected using the first temperature.

* * * * *